US012469679B2

(12) United States Patent
Chung et al.

(10) Patent No.: US 12,469,679 B2
(45) Date of Patent: Nov. 11, 2025

(54) SUBSTRATE TREATING APPARATUS

(71) Applicant: IUCF-HYU (INDUSTRY-UNIVERSITY COOPERATION FOUNDATION HANYANG UNIVERSITY), Seoul (KR)

(72) Inventors: Chin-Wook Chung, Seoul (KR); Yeong-Min Lim, Seoul (KR)

(73) Assignee: IUCF-HYU (INDUSTRY-UNIVERSITY COOPERATION FOUNDATION HANYANG UNIVERSITY), Seoul (KR)

(*) Notice: Subject to any disclaimer, the term of this patent is extended or adjusted under 35 U.S.C. 154(b) by 401 days.

(21) Appl. No.: 17/011,145

(22) Filed: Sep. 3, 2020

(65) Prior Publication Data

US 2021/0074514 A1 Mar. 11, 2021

(30) Foreign Application Priority Data

Sep. 5, 2019 (KR) ........................ 10-2019-0110057

(51) Int. Cl.
*H01J 37/32* (2006.01)

(52) U.S. Cl.
CPC .. *H01J 37/32174* (2013.01); *H01J 37/32715* (2013.01)

(58) Field of Classification Search
USPC .................................. 156/345.47; 118/723 E
See application file for complete search history.

(56) References Cited

U.S. PATENT DOCUMENTS 7,968,469 B2 * 6/2011 Collins ............. H01J 37/32091 156/345.47
9,593,411 B2 * 3/2017 Hoffman ........... H01J 37/32174
2003/0019581 A1 * 1/2003 Drewery ........... H01J 37/32082 156/345.43
2003/0037881 A1 * 2/2003 Barnes ................ H01J 37/3244 156/345.43
2004/0035365 A1 * 2/2004 Yamazawa ............ H01J 37/321 156/345.44
2013/0277333 A1 * 10/2013 Misra ................ H01J 37/32082 216/61
2015/0091441 A1 * 4/2015 Marakhtanov .... H01J 37/32174 315/111.21

FOREIGN PATENT DOCUMENTS

JP 4852189 B2 1/2012
KR 10-0362598 B1 2/2003
KR 10-2015-0039121 A 4/2015
KR 10-2017-0050046 A 5/2017

* cited by examiner

*Primary Examiner* — Ram N Kackar
(74) *Attorney, Agent, or Firm* — Sughrue Mion, PLLC

(57) ABSTRACT

The present invention relates to a substrate treating apparatus. According to one embodiment of the present invention, a substrate treating apparatus comprises: a chamber; a susceptor located at an inner side of the chamber to support a substrate subject to a process; an electrode plate having a pre-set area and located at an upper area inside the chamber; an RF power supply providing power for plasma generation and connected to the susceptor; and a plasma control member located on a branched conducting wire branching from a conducting wire, through which the RF power supply is connected to the susceptor, and grounded.

2 Claims, 5 Drawing Sheets

【FIG 1】
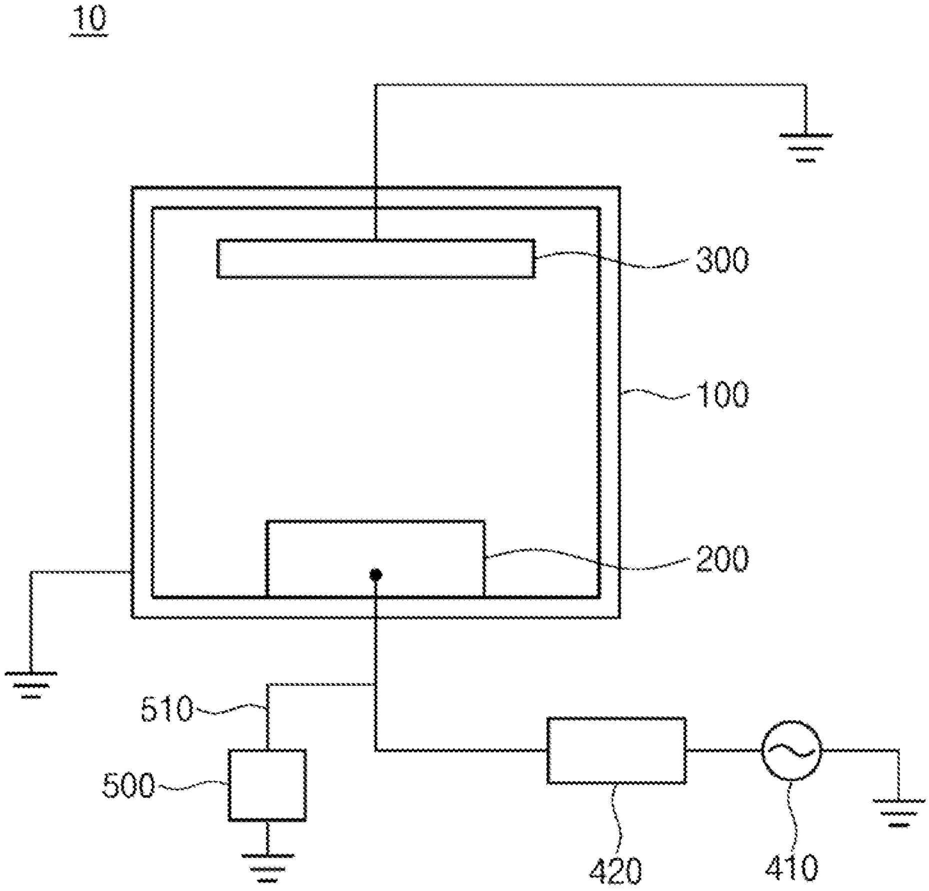

【 FIG 2】
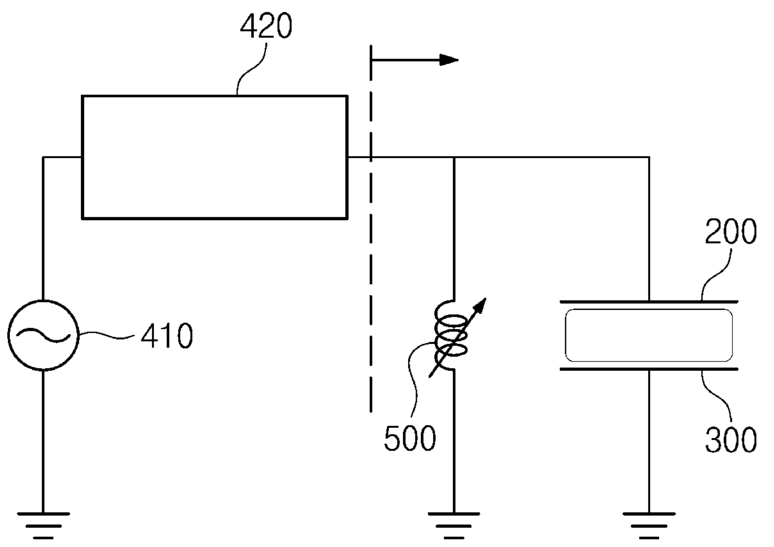

【 FIG 3】
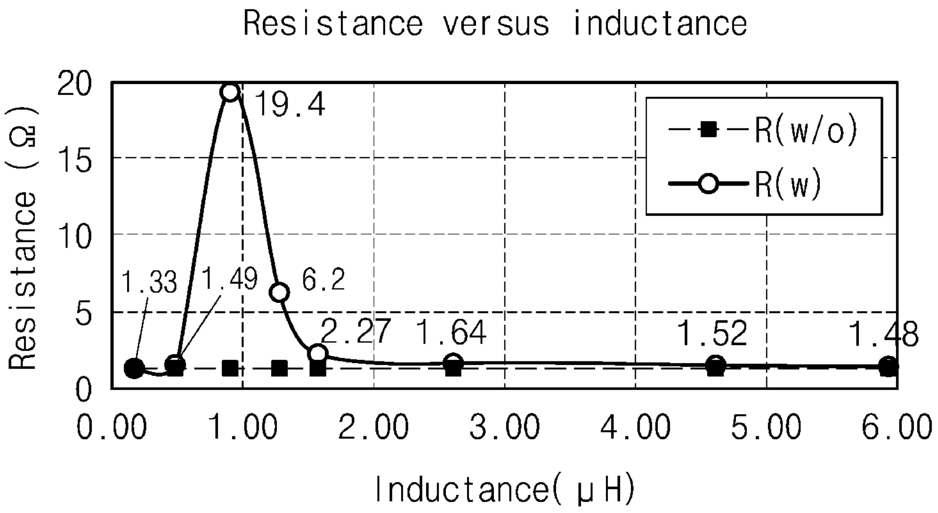

【FIG 4】
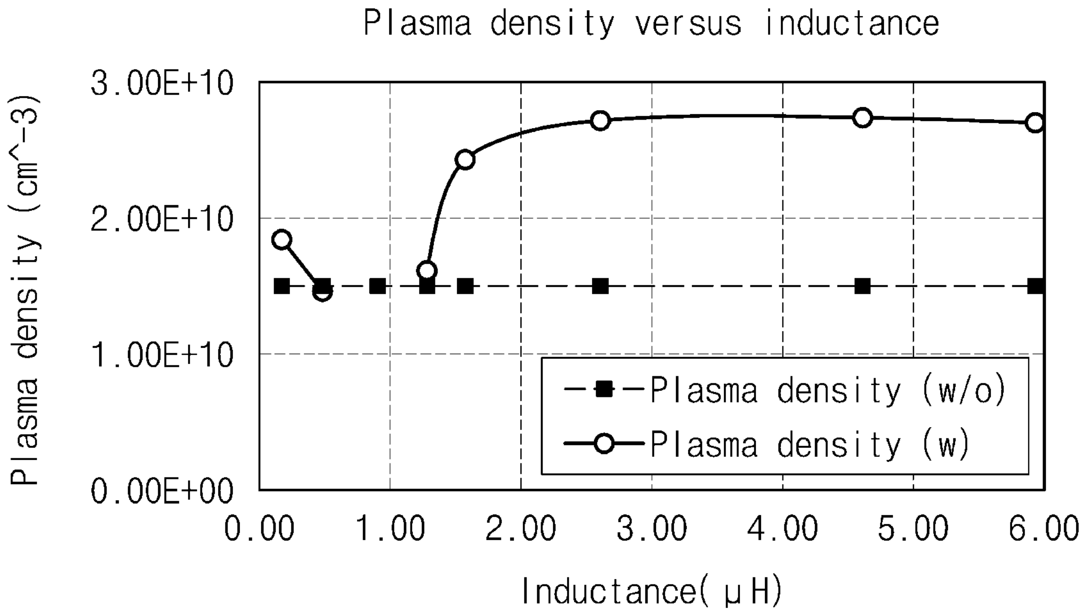

【 FIG 5】
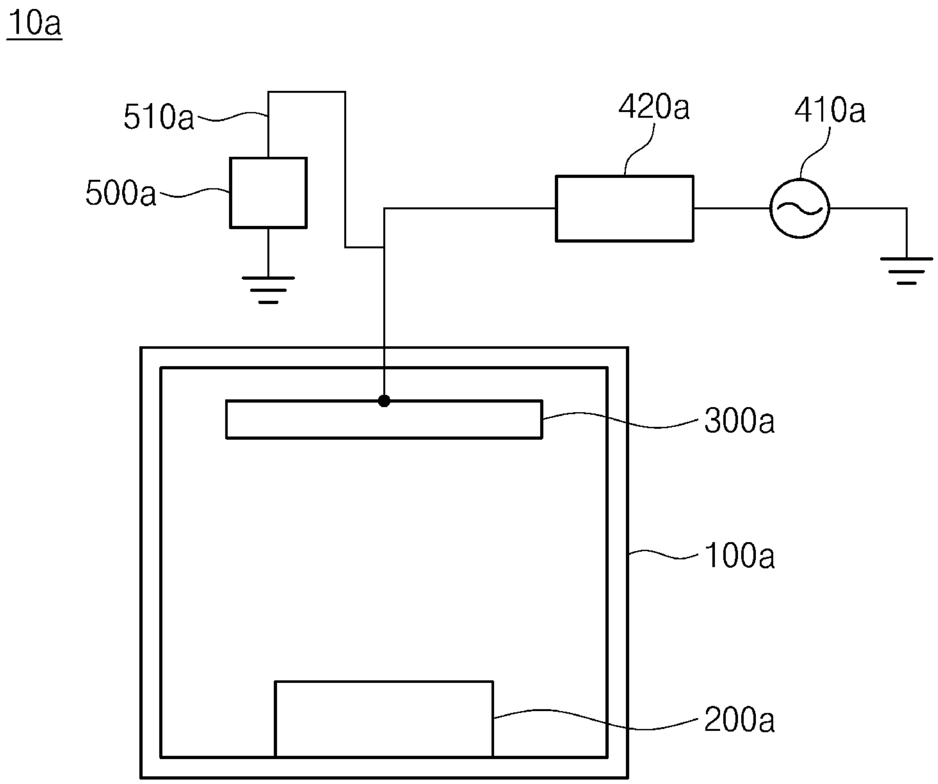

SUBSTRATE TREATING APPARATUS

BACKGROUND OF THE INVENTION

1. Field of the Invention

The present invention relates to a substrate treating apparatus and, more particularly, to a substrate treating apparatus capable of effectively adjusting a density of plasma.

2. Description of the Prior Art

In general, plasma refers to an ionized gas state composed of ions, electrons, radicals or the like, and the plasma is generated by a strong electric field or a high-frequency electromagnetic (RF) field.

As a plasma generating apparatus, a capacitively coupled plasma generating apparatus, an inductively coupled plasma (ICP) generating apparatus, a microwave plasma generating device and the like have been proposed according to an energy source for generating plasma.

SUMMARY OF THE INVENTION

The present invention is to provide a substrate treating apparatus capable of effectively adjusting a density of plasma.

In addition, the present invention is to provide a substrate treating apparatus capable of effectively generating high-density plasma.

Further, the present invention is to provide a substrate treating apparatus capable of generating plasma with high efficiency.

According to one aspect of the present invention, there may be provided a substrate treating apparatus comprising:

a chamber; a susceptor located at an inner side of the chamber to support a substrate subject to a process; an electrode plate having a pre-set area and located at an upper area inside the chamber; an RF power supply providing power for plasma generation and connected to the susceptor; and a plasma control member located on a branched conducting wire branching from a conducting wire, through which the RF power supply is connected to the susceptor, and grounded.

In addition, the plasma control member may include an inductive element.

Further, the plasma control member may include a variable inductor.

Furthermore, the branched conducting wire may branch from a point adjacent to the susceptor.

According to another aspect of the present invention, there may be provided a substrate treating apparatus comprising:

a chamber; a susceptor located at an inner side of the chamber to support a substrate subject to a process; an electrode plate having a pre-set area and located at an upper area inside the chamber; an RF power providing power for plasma generation and connected to the electrode plate; and a plasma control member located on a branched conducting wire branching from a conducting wire, through which the RF power supply is connected to the electrode plate, and grounded.

In addition, the plasma control member may include an inductive element.

According to one embodiment of the present invention, there may be provided a substrate treating apparatus capable of effectively adjusting a density of plasma.

In addition, according to one embodiment of the present invention, there may be provided a substrate treating apparatus capable of effectively generating high-density plasma.

Further, according to one embodiment of the present invention, there may be provided a substrate treating apparatus capable of generating plasma with high efficiency.

BRIEF DESCRIPTION OF THE DRAWINGS

FIG. 1 is a view showing a substrate treating apparatus according to one embodiment of the present invention.

FIG. 2 is a view showing an equivalent circuit of the substrate treating apparatus of FIG. 1.

FIG. 3 is a view showing resistance at an output terminal of a matching network according to inductance changes of a plasma control member.

FIG. 4 is a view showing a density of plasma generated in a chamber according to inductance changes of a plasma control member.

FIG. 5 is a view showing a substrate treating apparatus according to another embodiment.

DETAILED DESCRIPTION OF THE EXEMPLARY EMBODIMENTS

Hereinafter, embodiments of the present invention will be described in more detail with reference to the accompanying drawings. The embodiments of the present invention can be modified in various forms, and the scope of the present invention should not be interpreted as being limited to the following embodiments. The present embodiments are provided to more fully describe the present invention to those skilled in the art. Thus, the shape of the elements in the drawings has been exaggerated to emphasize a clearer explanation.

FIG. 1 is a view showing a substrate treating apparatus according to one embodiment of the present invention.

Referring to FIG. 1, the substrate treating apparatus 10 may include a chamber 100, a susceptor 200, an electrode plate 300, an RF power supply 410, a matching network 420 and a plasma control member 500.

The substrate treating apparatus 10 may treat a substrate by using plasma. For example, the substrate treating apparatus 10 may carry out an etching process, a deposition process, an ashing process, an ion injection process, etc., with regard to the substrate through plasma.

The chamber 100 may provide a space where a substrate subject to a process is located. The chamber 100 may include a conductive material such as aluminum, stainless steel, etc. The chamber 100 may include a grounded state. The chamber 100 may be formed with a hole for supplying gas to be used for processing the substrate into an inner space. In addition, the chamber 100 may be formed with a discharge hole for discharging gas, reaction by-products, etc., from the inner space.

The susceptor 200 may be located in a space formed at an inner side of the chamber 100 to support a substrate subject to a process. Power supply may be applied to the susceptor 200. The susceptor 200 may be electrically separated from a wall surface of the chamber (that is, insulated from the wall surface of the chamber 100).

The electrode plate 300 may be located in a space formed at an inner side of the chamber 100 to form an electric field for plasma generation in an inner space of the chamber 100. The electrode plate 300 may have a pre-set area and be located at an upper area inside the chamber 100. Accordingly, the electrode plate 300 may be spaced apart from the susceptor 200 at a pre-set distance and located above the susceptor 200. In this case, the electrode plate 300 may be provided apart from the chamber 100 of the electrode plate 300 or may be provided so that a partial area of an upper wall of the chamber 100 may function as the electrode plate 300.

The RF power supply 410 may provide power for generating an electric field for plasma generation. The RF power supply 410 may be connected to the susceptor 200. As one example, at least a partial area of the susceptor 200 may include a conductive material, and the RF power supply 410 may be connected to an area including a conductive material. Accordingly, an electric field may be formed between the susceptor 200 and the electrode plate 300 by the power applied to the susceptor 200 by the RF power supply 410, and the gas supplied into the inside of the chamber 100 may generate plasma by the electric field.

The matching network 420 may be located on a conducting wire, through which the RF power supply 410 is connected to the susceptor 200. The matching network 420 may perform impedance matching between the chamber 100 and the RF power supply 410.

The plasma control member 500 may be located on a conducting wire 510 (hereinafter a branched conducting wire) branching from a conducting wire, through which the RF power supply 410 is connected to the susceptor 200, and grounded. The branched conducting wire 510 may branch from a section between the susceptor 200 and the matching network 420. The plasma control member 500 may include an inductive element. As one example, the plasma control member 500 may include an inductor or a variable inductor.

FIG. 2 is a view showing an equivalent circuit of the substrate treating apparatus of FIG. 1.

Referring to FIG. 2, the plasma control member 500 may be located in parallel with the chamber 100. Specifically, the plasma control member 500 may be located in parallel with the susceptor 200 and the electrode plate 300. In this case, the susceptor 200 and the electrode plate 300 may have a serial relationship with each other. In addition, when the substrate treating apparatus 10 runs, the plasma control member 500 may be located in parallel with the susceptor 200, the electrode plate 300, and plasma generated between the susceptor 200 and the electrode plate 300.

FIG. 3 is a view showing resistance at an output terminal of a matching network according to inductance changes of a plasma control member.

A graph represented by a black square may indicate a resistance value when there is no plasma control member, and a graph represented by a circle may indicate a resistance value while the plasma control member is attached.

Referring to FIG. 3, a resistance value viewed from an output terminal of the matching network 420 toward the chamber 100 and the plasma control member 500 may vary depending on changes in an inductance size of the plasma control member 500. When the resistance value increases, the voltage applied to the chamber 100 may increase among the output voltages of the RF power supply 410. This means that a ratio of the power used for plasma generation is increased in the power supplied to the chamber 100 by the RF power supply 410. Preferably, the efficiency of plasma generation may be maximized when adjusting an inductance size of the plasma control member 500 to maximize a resistance value of the chamber 500, thereby allowing the plasma control member 500 and the chamber 100 to be in a resonant state.

FIG. 4 is a view showing a density of plasma generated in a chamber according to inductance changes of a plasma control member.

Referring to FIG. 4, the density of plasma generated from the chamber 100 may vary depending on changes in an inductance size of the plasma control member 500, while the same RF power supply 410 is used. Specifically, as the resistance value increases to raise the voltage applied to the chamber 100, the power used for plasma generation may increase, thereby increasing the density of the plasma. In FIG. 3, however, a difference between an inductance value of the plasma control member 500, in which resistance is a maximum value, and an inductance value of the plasma control member 500, in which plasma density is maximized, may be caused by an error generated in a process of measuring the resistance value. Specifically, the resistance value of FIG. 3 may be measured at the output terminal of the matching network 420 for ease of measurement. Accordingly, an error may be caused by a parasitic capacitance generated from a conducting wire between the output terminal of the matching network 420 and the chamber 100, or in a process of connecting a measuring device for resistance measurement. The error may be reduced by allowing the branched conducting wire 510 to branch from a point adjacent to the susceptor 200, and by measuring a resistance value at a point from which the branched conducting wire 510 branches, or a point adjacent to a point from which the branched conducting wire 510 branches.

As a density of plasma increases, a processing time may be shortened and process efficiency may be enhanced. Accordingly, it is preferable that the substrate treating apparatus performs a process while high-density plasma is generated. However, as the density of plasma increases due to the electrical conductivity of plasma, a resistance value of the chamber may decrease during a process. Accordingly, the voltage applied to the chamber among the output voltages of the power supply may decrease during a process, thereby lowering the efficiency of plasma generation. Thus, conventionally, to increase the density of plasma, the power supply has been replaced with one having a large output voltage. However, the method has had a problem of increasing the cost of equipment investment and lowering power efficiency.

On the other hand, the substrate treating apparatus 10 according to the present invention may use an inductive element to increase a resistance value of the chamber 100, thereby increasing the voltage applied to the chamber 100. Accordingly, in case of the substrate treating apparatus 10 according to the present invention, the efficiency of plasma generation and the power efficiency may be enhanced even without replacement of the power supply.

In addition, the substrate treating apparatus 10 according to the present invention may control the density of plasma generated by adjusting a resistance value of the chamber 100.

Further, a capacitor value of the chamber 100 may vary depending on a density of the gas used in a process, a flow rate of gas, a type of gas, a process temperature, a shape inside the chamber 100, a state of the inner surface of the chamber 100, and the like. In the substrate treating apparatus 10 according to the present invention, the plasma control member 500 may be provided to be capable of adjusting an inductance size, so that a resistance value may amount to a maximum value or within a pre-set band range including the maximum value at a point, from which the branched conducting wire branches, in response to a state of the chamber 100. Accordingly, the substrate treating apparatus 10 may effectively run even when a capacitor value of the chamber

100 is changed as a process condition of the chamber 100 is adjusted, or the maintenance of the chamber 100 is performed.

FIG. 5 is a view showing a substrate treating apparatus according to another embodiment.

Referring to FIG. 5, a substrate treating apparatus 10*a* may include a chamber 100*a*, a susceptor 200*a*, an electrode plate 300*a*, an RF power supply 410*a*, a matching network 420*a* and a plasma control member 500*a*.

Since a configuration of the chamber 100*a*, the susceptor 200*a*, and the electrode plate 300*a* is the same as or similar to the configuration of the substrate treating apparatus 10 of FIG. 1, repeated descriptions are omitted.

The RF power supply 410*a* may provide power for generating an electric field for plasma generation. The RF power supply 410*a* may be connected to the electrode plate 300*a*.

The matching network 420*a* may be located on a conducting wire, through which the RF power supply 410*a* is connected to the electrode plate 300*a*. The matching network 420*a* may perform impedance matching between the chamber 100*a* and the RF power supply 410*a*.

The plasma control member 500*a* may be located on a conducting wire 510*a* branching from a conducting wire, through which the RF power supply 410 is connected to the susceptor 200, and grounded. The branched conducting wire 510*a* may branch from a section between the susceptor 200*a* and the matching network 420*a*. Accordingly, the plasma control member 500*a* may be located in parallel with the chamber 100*a*, similar to FIG. 1.

The size control and function of the plasma control member 500*a* are the same as those of FIG. 1, and thus repeated descriptions are omitted.

The above detailed description is to illustrate the present invention. In addition, the above-described content is to describe preferred embodiments of the present invention, and the present invention can be used in various other combinations, modifications and environments. In other words, changes or modifications can be made within the scope of the concept of the invention disclosed in the present specification, the scope equivalent to the disclosed contents, and/or the scope of technology or knowledge in the art. The above-described embodiments are to describe the best state for implementing the technical idea of the present invention, and it is also possible to make various changes required in specific application fields and uses of the present invention. Thus, the above detailed description of the present invention is not intended to limit the present invention to the disclosed embodiments. In addition, the appended claims should be construed to include other embodiments.

DESCRIPTION OF REFERENCE NUMERALS

| | |
|---|---|
| 100: Chamber | 200: Susceptor |
| 300: Electrode plate | 410: RF power supply |
| 420: Matching network | 500: Plasma control member |

What is claimed is:

1. A substrate treating apparatus comprising:
a chamber;
a susceptor located at an inner side of the chamber and configured to support a substrate subject to a process;
a grounded electrode plate having a pre-set area and located at an upper area inside the chamber;
a radio frequency (RF) power supply configured to provide power for plasma generation and connected to the susceptor;
a matching network configured to perform impedance matching between the chamber and the RF power supply, and located on a first conducting wire through which the RF power supply is connected to the susceptor;
a variable inductor as a plasma control member located on a second conducting wire, wherein the second conducting wire is grounded, and is branched from the first conducting wire at a point adjacent to the susceptor to reduce parasitic impedance; and
wherein, in response to a measurement of impedance looking towards the plasma chamber an inductance the variable inductor is adjusted to maximize a resistance value at a branch point that the second conducting wire is branched from the first conducting wire, to cause the plasma control member and the chamber to be in a resonant state,
to increase a density of the plasma.

2. A substrate treating apparatus comprising:
a chamber;
a grounded susceptor located at an inner side of the chamber and configured to support a substrate subject to a process;
an electrode plate having a pre-set area and located at an upper area inside the chamber;
a radio frequency (RF) power supply configured to provide power for plasma generation and connected to the electrode plate;
a matching network configured to perform impedance matching between the chamber and the RF power supply, and located on a first conducting wire that connects the RF power supply with the electrode plate;
a variable inductor as a plasma control member located on a second conducting wire, wherein the second conducting wire is grounded and is branched from the first conducting wire at a point adjacent to the electrode plate to reduce parasitic impedance; and
wherein, in response to a measurement of impedance looking towards the plasma chamber an inductance of the variable inductor is adjusted to maximize a resistance value at a branch point that the second conducting wire is branched from the first conducting wire or to set the resistance value to be within a pre-set band range including a maximum value, which causes the plasma control member and the chamber to be in a resonant state, to increase a density of the plasma.

* * * * *